United States Patent [19]

Kimura et al.

[11] 4,442,178

[45] Apr. 10, 1984

[54] SOS SUBSTRATE FOR SEMICONDUCTOR DEVICE

[75] Inventors: Minoru Kimura, Yokohama; Bunzi Takeuchi, Sagamihara, both of Japan

[73] Assignee: Tokyo Shibarua Denki Kabushiki Kaisha, Japan

[21] Appl. No.: 422,371

[22] Filed: Sep. 24, 1982

[30] Foreign Application Priority Data

Nov. 25, 1981 [JP] Japan .................................. 56-188842

[51] Int. Cl.$^3$ ............................................. H01L 21/20
[52] U.S. Cl. ..................................... 428/446; 428/702; 148/33; 156/DIG. 61
[58] Field of Search ............... 428/641, 620, 702, 446; 156/DIG. 61, DIG. 64; 148/175, 33; 357/60; 125/30 R

[56] References Cited

U.S. PATENT DOCUMENTS 4,131,496  12/1978  Weitzel et al. ......................... 357/60

OTHER PUBLICATIONS

Chang, *Silicon-on-Sapphire Epitaxy by Vacuum Sublimation*, pp. 500–511, Journal of Vacuum Science and Technology, vol. 8, No. 3, 12/22/70.

Nolder et al, *Heteroepitaxial Silicon–Aluminum Oxide Interface, Part II Orientation Relations of Single-Crystal Silicon on Alpha Aluminum Oxide*, Transactions of Metallurgical Society of AIME, vol. 233, Mar. 1965, pp. 549–556.

J. E. A. Maurits, "Problems and Solutions in the Preparation of SOS Wafers", Solid State Technology (Apr. 1977) pp. 81–86.

*Primary Examiner*—L. Dewayne Rutledge
*Assistant Examiner*—S. Kastlee
*Attorney, Agent, or Firm*—Finnegan, Henderson, Farabow, Garrett & Dunner

[57] ABSTRACT

The invention provides an SOS substrate for a semiconductor device wherein an epitaxial silicon layer which has an index of plane (100) is formed on a single crystal sapphire plate which has an index of plane ($\overline{1}012$). An orientation flat is formed at an incline angle of 2.1 to 2.2° with respect to a [011] or [0$\overline{1}$1] direction on the surface of the epitaxial silicon layer which has the index of plane (100). The direction of the orientation flat on the surface of the sapphire plate is aligned with the direction of a cleavage plane of the sapphire plate.

2 Claims, 4 Drawing Figures

SOS SUBSTRATE FOR SEMICONDUCTOR DEVICE

BACKGROUND OF THE INVENTION

The present invention relates to an SOS (silicon on sapphire) substrate used for the manufacture of a semiconductor device.

An SOS substrate for a semiconductor device has an SOS structure wherein a thin layer of silicon is formed on a single crystal sapphire plate by hetero-epitaxial growth. The SOS structure allows the complete isolation of elements in the semiconductor device. Furthermore, parasitic capacitance can be greatly decreased. Thus, the SOS structure is receiving great attention in LSI and ultra-LSI techniques.

Generally, the substrate used in the manufacture of the semiconductor device has an outer appearance of disc shape, and has one cut surface (to be referred to as an orientation flat herein after). A case will be described wherein a single crystal silicon substrate (to be referred to as a bulk silicon substrate hereinafter) is used. FIG. 1 is a perspective view showing an example of the bulk silicon substrate. A substantially disc-shaped bulk silicon substrate 1 has a top surface indicated by an index of plane (100) and its orientation flat 2 is formed in the direction of [011]. Generally, the orientation flat 2 is formed perpendicularly to the surface of the bulk silicon substrate 1.

FIG. 1 shows only one example of the bulk silicon substrate. In any bulk silicon substrate, however, its top surface has a predetermined index of plane, and its orientation flat is formed along a predetermined direction due to the following reason. The characteristics of the semiconductor element formed on the surface layer of the substrate substantially depend on the crystal face of the surface and a crystallographic axis along which the semiconductor element is formed. Therefore, in order to form a semiconductor element which has predetermined electrical characteristics, a substrate having a surface of predetermined crystal face must be used. Furthermore, an orientation flat extending along a predetermined crystal orientation is required as a reference to determine the direction of the crystallographic axis on the surface of the substrate.

This is also the case for the SOS substrate. FIG. 2 shows an orientation flat 6 of an SOS substrate 3. Referring to FIG. 2, an epitaxial silicon layer 5 is grown on a single crystal sapphire plate 4. It is known by studies made so far that a crystal face (100) of silicon epitaxially grows on the crystal face ($\bar{1}012$) of sapphire to obtain excellent epitaxial growth. Therefore, generally, a conventional SOS substrate 3 is used wherein a silicon layer 5 having a surface with an index of plane (100) is grown on the surface of the sapphire plate 4 which has an index of plane ($\bar{1}012$).

In the conventional SOS substrate 3, an orientation flat 6 is formed at an incline of 45° from a projection line [$\bar{1}011$] obtained by projecting the C-axis [0001] of the sapphire plate 4 onto the surface of the sapphire plate 4 which has an index of plane ($\bar{1}012$). In this case, the direction of the orientation flat 6 corresponds to the direction [011] of the epitaxial silicon layer 5.

On the other hand, when the epitaxial silicon layer 5 is grown on the surface of the sapphire plate 4 which has an index of plane ($\bar{1}012$), it is assumed that the cleavage planes of the sapphire plate 4 are nearly parallel or perpendicularly to the orientation flat 6 of the epitaxial silicon layer 5 ("Solid State Technology", April, 1977, PP 81 to 86, J. E. A. Maurits). This assumption supports the formation of the orientation flat of the SOS substrate 3 in the manner as described above.

However, the present inventors have analyzed the conventional SOS substrate 3 in detail. As shown in FIG. 3 which illustrates the rear view of the SOS substrate 3, the ridgeline of the orientation flat 6 is slightly misaligned with the line of intersection between the cleavage plane 7 {$01\bar{1}2$} of the sapphire plate 4 and the crystal face of the sapphire plate 4 having an index of plane ($\bar{1}012$), that is, with the direction indicated by $<2\bar{2}01>$.

In the process for manufacturing a semiconductor device having an SOS structure, the SOS substrate 3 is diced into chips in the following manner when the wafer process is completed. As shown in FIG. 3, the surface of the sapphire plate 4 of the SOS substrate 3 is scribed by a diamond stylus in directions parallel and perpendicular to the orientation flat 6, and is thus diced into chips. As described above, in the conventional SOS substrate 3, since the direction of cleavage plane 7 on the surface of the sapphire plate 4 does not match the direction of the orientation flat 6, the scribing direction is misaligned from the direction of the cleavage plane 7. Therefore, as compared with dicing along the direction of the cleavage plane, cracking tends to occur. Furthermore, if the scribing depth is not deep enough, dicing cannot be readily performed. In practice, as compared with dicing of the bulk silicon substrate, the number of scribing operations is increased several times. Thus, the wear of the diamond stylus is great.

SUMMARY OF THE INVENTION

An object of the present invention is to provide an SOS substrate wherein cracks may not form when the SOS substrate is cut into chips after a so-called wafer process is completed, and the SOS substrate has a structure which allows easy dicing, in a process for manufacturing a semiconductor device which has an SOS structure.

In order to achieve the above object of the present invention, there is provided an SOS substrate comprising: a single crystal sapphire plate which has a surface with an index of plane ($\bar{1}012$); an epitaxial silicon layer which has a surface with an index of plane (100) and which is grown on said surface of sapphire plate; and an end face as an orientation flat which is inclined by an angle of 2.1° to 2.2° with respect to a $<110>$ direction of said epitaxial silicon layer.

The present inventors confirmed by their extensive studies that the [$2\bar{2}01$] direction is deviated by about 2.14° with respect to the orientation flat 6, as shown in FIG. 3. Therefore, according to the present invention, the direction of the orientation flat is aligned with the direction of the cleavage plane of the sapphire plate to achieve the object of the present invention.

DETAILED DESCRIPTION OF THE PREFERRED EMBODIMENT

Figure 1:
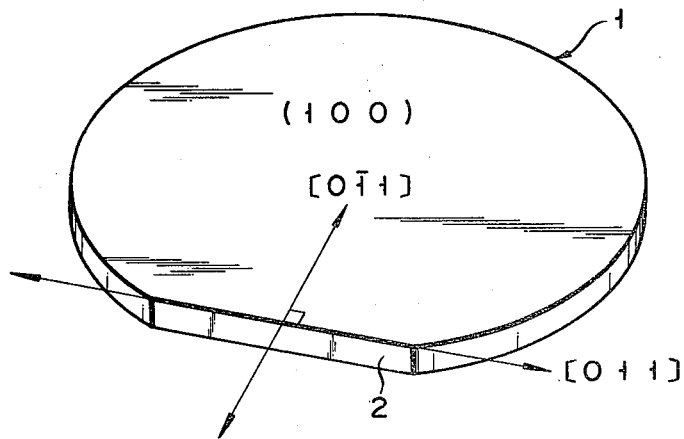
FIG. 1 is a perspective view showing an example of a bulk silicon substrate.
Figure 2:
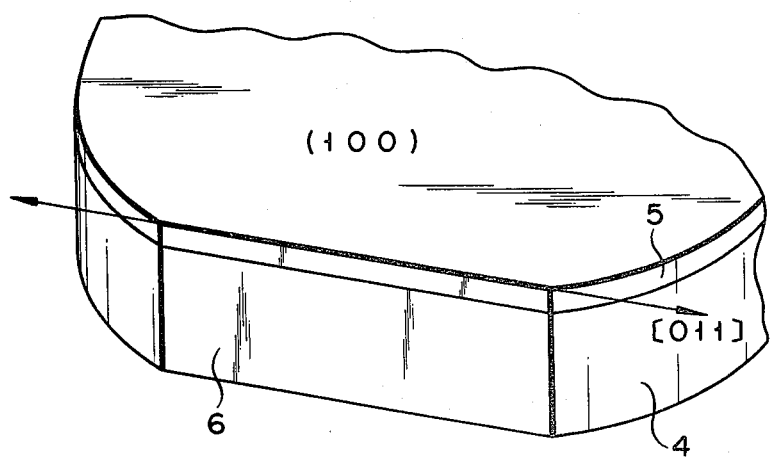
FIG. 2 is a perspective view showing part of an orientation flat of a conventional SOS substrate.
Figure 3:
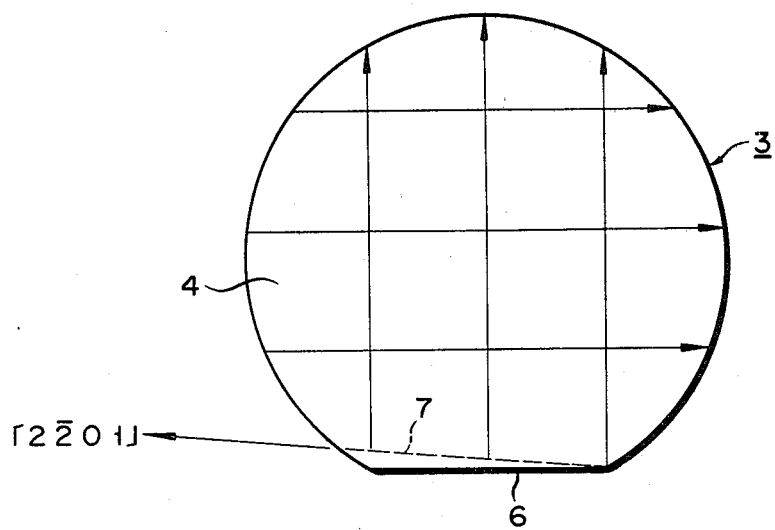
FIG. 3 is a rear view showing the scribing direction on the conventional SOS substrate with reference to its problems.
Figure 4:
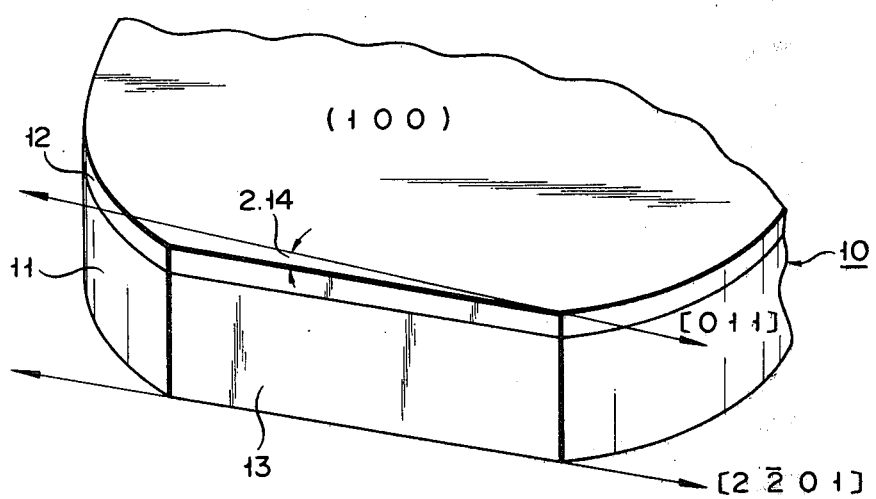
FIG. 4 is a perspective view showing an orientation flat of an SOS substrate according to an embodiment of the present invention.

FIG. 4 is a perspective view showing an orientation flat of an SOS substrate 10 according to an embodiment of the present invention. Referring to FIG. 4, reference numeral 11 denotes a single crystal sapphire plate. The sapphire plate 11 has a disc shape and has a top surface indicated by an index of plane ($\bar{1}012$). Two types of directions [$\bar{2}201$] and [$02\bar{2}1$] which intersect with the cleavage plane [$\bar{1}012$] are present on the top surface of the sapphire plate 11. The directions [$\bar{2}201$] and [$02\bar{2}1$] are perpendicular to each other. An epitaxial silicon layer 12 is formed on the top surface of the sapphire plate 11 which has an index of plane ($\bar{1}012$). The surface of the epitaxial silicon layer 12 has an index of plane (100). In the SOS substrate 10 of this embodiment, an orientation flat 13 is formed to be inclined by an angle of 2.14° with respect to the [011] direction on the surface of the epitaxial silicon layer 12. As a result, the ridgeline of the orientation flat 13 is confirmed to be aligned with a [$\bar{2}201$] direction which is a line of intersection between the cleavage plane [$\bar{1}012$] and the top surface of the sapphire plate 11. Therefore, another direction of line of intersection indicated by [$02\bar{2}1$] between the top surface of the sapphire plate 11 and the cleavage plane [$\bar{1}012$] is perpendicular to the orientation flat 13 on the top surface of the sapphire plate 11.

In the SOS substrate 10 with the above structure, the scribing direction at the time of dicing is aligned with the direction of the cleavage plane of the sapphire plate 11 after the wafer process is completed in the manufacture of the semiconductor device. Therefore, unlike the conventional SOS substrate, dicing can be performed with a shallow scribing depth. As a result, the service life of the diamond stylus used in scribing is prolonged. Since the dicing direction of the conventional SOS substrate is misaligned with the direction of the cleavage plane, microcracks occur substantially perpendicularly to the scribing direction to extend to the element region. This adversely affects the electrical characteristics of the element. However, in the SOS substrate 10 according to the present invention, this problem can be eliminated.

In the SOS substrate of the above embodiment, the direction of the orientation flat 13 does not correspond to the [011] direction of the epitaxial silicon layer 12. Therefore, if the orientation flat 13 is used as an alignment reference to form an element in the same manner as in the conventional SOS substrate, the formed element is deviated by 2.14° from the proper direction. However, an error of 2° to 3° does not substantially affect the electrical characteristics of the element. Therefore, even if the SOS substrate 10 of the above embodiment is used, the conventional manufacturing process can be adopted.

In the above embodiment, the orientation flat 13 is inclined by 2.14° from the [011] direction of the epitaxial layer 12. However, the [$0\bar{1}1$] direction of the epitaxial silicon layer 12 may also be used as the reference. In this case, the [$2\bar{2}01$] direction on the surface of the sapphire plate 11 is perpendicular to the direction of the orientation flat and the [$02\bar{2}1$] direction of another cleavage plane is aligned with the orientation flat.

The overall shape of the SOS substrate need not be a disc shape. For example, the SOS substrate may have a square or rectangular shape, provided that the direction of at least one end face is inclined by 2.14° with respect to the [011] or [$0\bar{1}1$] direction on the surface of the epitaxial silicon layer which has an index of plane (100).

What we claim is:

1. An SOS substrate for a semiconductor device, comprising:
   a single crystal sapphire plate which has a surface with an index of plane ($\bar{1}012$);
   an epitaxial silicon layer which has a surface with an index of plane (100) and which is formed on the surface of said sapphire plate; and
   an end face on said SOS substrate, said end face being inclined by an angle of 2.1° to 2.2° with respect to the [011] of [$0\bar{1}1$] crystallographic direction of said silicon.

2. An SOS substrate according to claim 1, wherein said SOS substrate has a disc shape, except for a portion at which said end face is formed.

* * * * *